(12) United States Patent
Chen et al.

(10) Patent No.: US 12,213,354 B2
(45) Date of Patent: Jan. 28, 2025

(54) DISPLAY PANEL AND ELECTRONIC DEVICE

(71) Applicant: BOE Technology Group Co., Ltd., Beijing (CN)

(72) Inventors: Hao Chen, Beijing (CN); Jinxiang Xue, Beijing (CN); Liang Chen, Beijing (CN); Jiao Zhao, Beijing (CN); Li Xiao, Beijing (CN); Dongni Liu, Beijing (CN); Seungwoo Han, Beijing (CN); Haoliang Zheng, Beijing (CN); Minghua Xuan, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 391 days.

(21) Appl. No.: 17/585,026

(22) Filed: Jan. 26, 2022

(65) Prior Publication Data

US 2022/0254858 A1    Aug. 11, 2022

(30) Foreign Application Priority Data

Feb. 5, 2021    (CN) .......................... 202110163732.2

(51) Int. Cl.
*H10K 59/131*    (2023.01)
*G09F 9/30*    (2006.01)
*H10K 50/844*    (2023.01)
*H10K 59/121*    (2023.01)
*H10K 102/00*    (2023.01)

(52) U.S. Cl.
CPC ........... *H10K 59/131* (2023.02); *G09F 9/301* (2013.01); *H10K 50/844* (2023.02); *H10K 59/1213* (2023.02); *H10K 2102/311* (2023.02)

(58) Field of Classification Search
CPC .............. H10K 59/131; H10K 50/844; H10K 59/1213; H10K 2102/311; H10K 59/873; G09F 9/301; G09F 9/33
See application file for complete search history.

(56) References Cited

U.S. PATENT DOCUMENTS

| | | | |
|---|---|---|---|
| 10,379,682 B2* | 8/2019 | Hayashi | G06F 3/0412 |
| 2016/0118451 A1* | 4/2016 | Youn | H10K 59/124 |
| | | | 257/66 |
| 2018/0190721 A1* | 7/2018 | Liu | B32B 37/06 |
| 2019/0163005 A1* | 5/2019 | Hsu | H10K 59/38 |

* cited by examiner

*Primary Examiner* — Mohammad A Rahman
(74) *Attorney, Agent, or Firm* — IPro, PLLC

(57) ABSTRACT

A display panel is provided. The display panel includes a base substrate and a plurality of display units disposed on the base substrate. The display unit includes a signal line, a light-emitting device and a drive unit. The light-emitting device is disposed in a flexible display region of the base substrate, the drive unit is disposed in a pixel circuit region of the base substrate, and the signal line is connected with the light-emitting device and the drive unit.

20 Claims, 5 Drawing Sheets

DISPLAY PANEL AND ELECTRONIC DEVICE

CROSS-REFERENCE TO RELATED APPLICATION

This application claims priority to Chinese Patent Application No. 202110163732.2, filed on Feb. 5, 2021 and entitled "DISPLAY PANEL AND ELECTRONIC DEVICE", the disclosure of which is herein incorporated by reference in its entirety.

TECHNICAL FIELD

The present disclosure relates to the field of display technologies, and in particular, to a display panel and an electronic device.

BACKGROUND

At present, flexible display panels are flexible display assemblies that may be stretched, folded or bent.

A flexible display panel includes a substrate, and a drive circuit and a light-emitting device which are sequentially disposed on the substrate. The drive circuit is configured to drive the light-emitting device to emit light.

SUMMARY

Embodiments of the present disclosure provide a display panel and an electronic device. The technical solutions are as follows.

In an aspect of the embodiments of the present disclosure, a display panel is provided. The display panel includes: a base substrate comprising a flexible display region and a pixel circuit region; and a plurality of display units disposed on the base substrate, wherein the display unit comprises a signal line, a light-emitting device and a drive unit, wherein the light-emitting device is disposed in the flexible display region, the drive unit is disposed in the pixel circuit region, and the signal line is connected with the light-emitting device and the drive unit.

In some embodiments, the light-emitting device comprises a light-emitting layer and a first electrode, wherein the first electrode and the light-emitting layer are sequentially disposed on the base substrate, the signal line is disposed on the base substrate provided with the light-emitting device, and the light-emitting layer is connected with the signal line and the first electrode.

In some embodiments, the signal line is disposed on the base substrate, and the light-emitting device comprises a light-emitting layer and a first electrode, wherein the light-emitting layer and the first electrode are sequentially disposed on the base substrate provided with the signal line, and the light-emitting layer is connected with the signal line and the first electrode.

In some embodiments, the first electrode is a first electrode layer, and the light-emitting devices in the plurality of display units share the first electrode layer.

In some embodiments, the flexible display region is a stretchable display region and is provided with a plurality of grooves, wherein the groove is disposed between the light-emitting devices in at least two of the plurality of display units.

In some embodiments, the grooves are disposed around the light-emitting device in at least one of the plurality of display units.

In some embodiments, the plurality of grooves comprise at least one type of sunken grooves and through grooves.

In some embodiments, the display panel includes a first insulating layer, a second insulating layer and a first encapsulating layer which are disposed in the flexible display region, wherein the first insulating layer is disposed between the first electrode and the base substrate, the second insulating layer is disposed between the light-emitting layer and the signal line, and the first encapsulating layer is disposed on a side of the signal line distal from the base substrate.

In some embodiments, the display panel includes a first insulating layer, a second insulating layer and a first encapsulating layer which are disposed in the flexible display region, wherein the first insulating layer is disposed between the signal line and the light-emitting layer, the second insulating layer is disposed between the light-emitting layer and the first electrode, and the first encapsulating layer is disposed on a side of the first electrode distal from the base substrate.

In some embodiments, the display panel includes a signal line layer, and a drive circuit layer and a flexible layer which are sequentially disposed in the pixel circuit region, wherein the drive circuit layer comprises a plurality of drive units, and the signal line layer comprises a plurality of signal lines and the signal line layer is disposed on a side of the flexible layer distal from the base substrate.

In some embodiments, the display panel further includes a third insulating layer, a fourth insulating layer and a second encapsulating layer which are disposed in the pixel circuit region, wherein the third insulating layer is disposed between the base substrate and the drive circuit layer, the fourth insulating layer is disposed between the flexible layer and the signal line layer, and the second encapsulating layer is disposed on a side of the signal line layer distal from the base substrate.

In some embodiments, the display panel includes a signal line layer, and a drive circuit layer and a flexible layer which are sequentially disposed in the pixel circuit region, wherein the signal line layer is disposed between the drive circuit layer and the base substrate, the drive circuit layer comprises a plurality of drive units, and the signal line layer comprises a plurality of signal lines.

In some embodiments, the base substrate includes a plurality of slots in the pixel circuit region, wherein the slot is disposed between at least two of the drive units.

In some embodiments, the signal line is made of a light-transparent conductive material.

In some embodiments, a material of the signal line comprises one of a metal nanowire, a carbon nanotube, graphene, a conductive polymer and liquid metal.

In some embodiments, the pixel circuit region is disposed on at least one of two opposite sides of the flexible display region.

In some embodiments, the base substrate comprises a first base disposed in the flexible display region and a second base disposed in the pixel circuit region, wherein a material of the first base and a material of the second base comprise a flexible material.

In some embodiments, the first base and the second base are of an integrated structure.

In some embodiments, the signal line is disposed on the base substrate; and the light-emitting device comprises a light-emitting layer and a first electrode, wherein the first electrode and the light-emitting layer are sequentially disposed on the base substrate provided with the signal line, the light-emitting layer is connected with the signal line and the first electrode, the first electrode is a first electrode layer, and the light-emitting devices in the plurality of display units share the first electrode layer; the flexible display region is a stretchable display region and is provided with a plurality of grooves, wherein the groove is disposed between the light-emitting devices in at least two of the plurality of display units; the grooves are disposed around the light-emitting device in at least one of the plurality of display units; the display panel comprises a first insulating layer, a second insulating layer and a first encapsulating layer which are disposed in the flexible display region, wherein the first insulating layer is disposed between the first electrode and the base substrate, the second insulating layer is disposed between the light-emitting layer and the signal line, and the first encapsulating layer is disposed on a side of the signal line distal from the base substrate; the display panel comprises a signal line layer, and a drive circuit layer and a flexible layer which are sequentially disposed in the pixel circuit region, wherein the drive circuit layer comprises a plurality of drive units, and the signal line layer comprises a plurality of signal lines and the signal line layer is disposed on a side of the flexible layer distal from the base substrate; the display panel further comprises a third insulating layer, a fourth insulating layer and a second encapsulating layer which are disposed in the pixel circuit region, wherein the third insulating layer is disposed between the base substrate and the drive circuit layer, the fourth insulating layer is disposed between the flexible layer and the signal line layer, and the second encapsulating layer is disposed on a side of the signal line layer distal from the base substrate; and the first encapsulating layer and the second encapsulating layer are of an integrated structure.

In an aspect of the embodiments of the present disclosure, an electronic device is provided. The electronic device includes a display panel, wherein the display panel comprises: a base substrate, comprising a flexible display region and a pixel circuit region; and a plurality of display units disposed on the base substrate, wherein the display unit comprises a signal line, a light-emitting device and a drive unit, wherein the light-emitting device is disposed in the flexible display region, the drive unit is disposed in the pixel circuit region, and the signal line is connected with the light-emitting device and the drive unit.

BRIEF DESCRIPTION OF THE DRAWINGS

The accompanying drawings, which are incorporated in and constitute a part of this specification, illustrate embodiments consistent with the present disclosure, and together with the description, serve to explain the principles of the present disclosure.

To describe the technical solutions in the embodiments of the present disclosure more clearly, the following briefly introduces the accompanying drawings required for describing the embodiments. Apparently, persons of ordinary skill in the art may still derive other drawings from these accompanying drawings without creative efforts.

DETAILED DESCRIPTION

Figure 1:
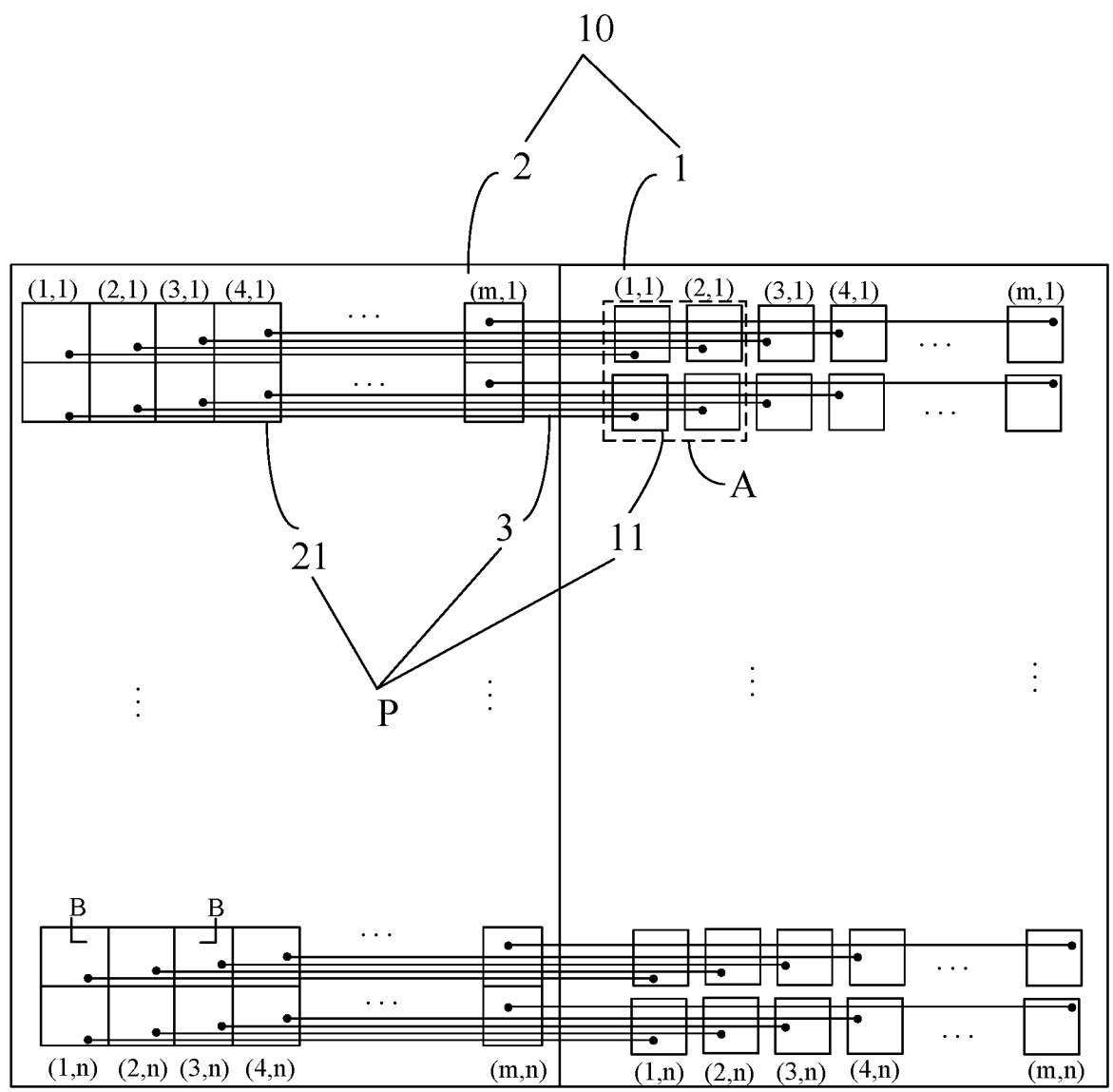
FIG. 1 is a schematic diagram of a planar structure of a display panel according to an exemplary embodiment of the present disclosure.

For clearer descriptions of the objectives, technical solutions and advantages in embodiments of the present disclosure, the technical solutions in the embodiments of the present disclosure are clearly and comprehensively described below with reference to the accompanying drawings in the embodiments of the present disclosure. Apparently, the embodiments described are merely some but not all embodiments of the present disclosure. Based on the embodiments of the present disclosure, all other embodiments derived by persons of ordinary skill in the art without creative efforts shall fall within the scope of the present disclosure.

With the development of information technology, display panels such as liquid crystal display (LCD) panels, organic light-emitting diode (OLED) display panels, quantum dot light-emitting diode (QLED) display panels, and micro light-emitting diode (Micro LED) display panels are constantly updated and have entered a new era of diversity. In recent years, various bent and foldable OLED display panels are being actively developed due to their unique flexibility performance, and the display technology develops towards the direction of shape-changeable stretchable display devices.

However, the stress on the display device in a stretched state is a major challenge at present. At this stage, an active-matrix organic light-emitting diode (AMOLED) display panel includes a drive circuit consisting of thin film transistors to actively drive a light-emitting device, but the property of the thin film transistors changes greatly in the state of deformation such as being stretched and thus the thin film transistors may not drive the light-emitting device effectively. As a result, the traditional AMOLED back plate cannot be well applied in the stretchable display device.

Currently, in a passive matrix organic light-emitting diode display panel, stretchable display is generally achieved by releasing strain during stretch by means of a hollowed-out region between light-emitting devices. However, if this hollowed-out structure is directly applied to the AMOLED display panel, it causes damage to the thin film transistor, which directly affects the stability of the AMOLED display panel.

In order to solve the technical problem that the drive circuit of the AMOLED display panel is easily damaged, inventors of the present disclosure find that the above problem may be overcome by changing the structure of laminating the light-emitting device on the drive circuit in the original AMOLED structure. Specifically, drive circuits of light-emitting devices in a region (such as a flexible display region) are disposed outside this region, and the light-emitting device and the drive circuit are connected through a flexible signal line. In this structure, the thin film transistor in the drive circuit no longer bears the stress caused by stretch, and thus the drive circuit can be prevented from being damaged.

Therefore, the technical idea of the embodiments of the present disclosure is to change the synchronized integration structure of the drive circuit and the light-emitting device in the original AMOLED, and to separate the drive circuit from the light-emitting device, that is, dispose the thin-film transistor drive circuit in a non-stretch region, so that drive circuit no longer bears the stress caused by stretch. It may be understood by persons skilled in the art that various variations or derivatives of technical solutions based on this technical idea shall fall within the scope covered by the basic technical idea of the present disclosure.

Persons skilled in the art generally know that the AMOLED display panel is an active matrix organic light-emitting diode panel. An active matrix (AM) refers to the pixel addressing technology. The active matrix greatly reduces the amount of control lines, and thus has the properties of low power consumption, high resolution, high response speed and other excellent optoelectronic properties.

To facilitate the understanding of the technical idea of the present disclosure, the embodiments of the present disclosure are illustrated below with reference to the accompanying drawings.

Figure 2:
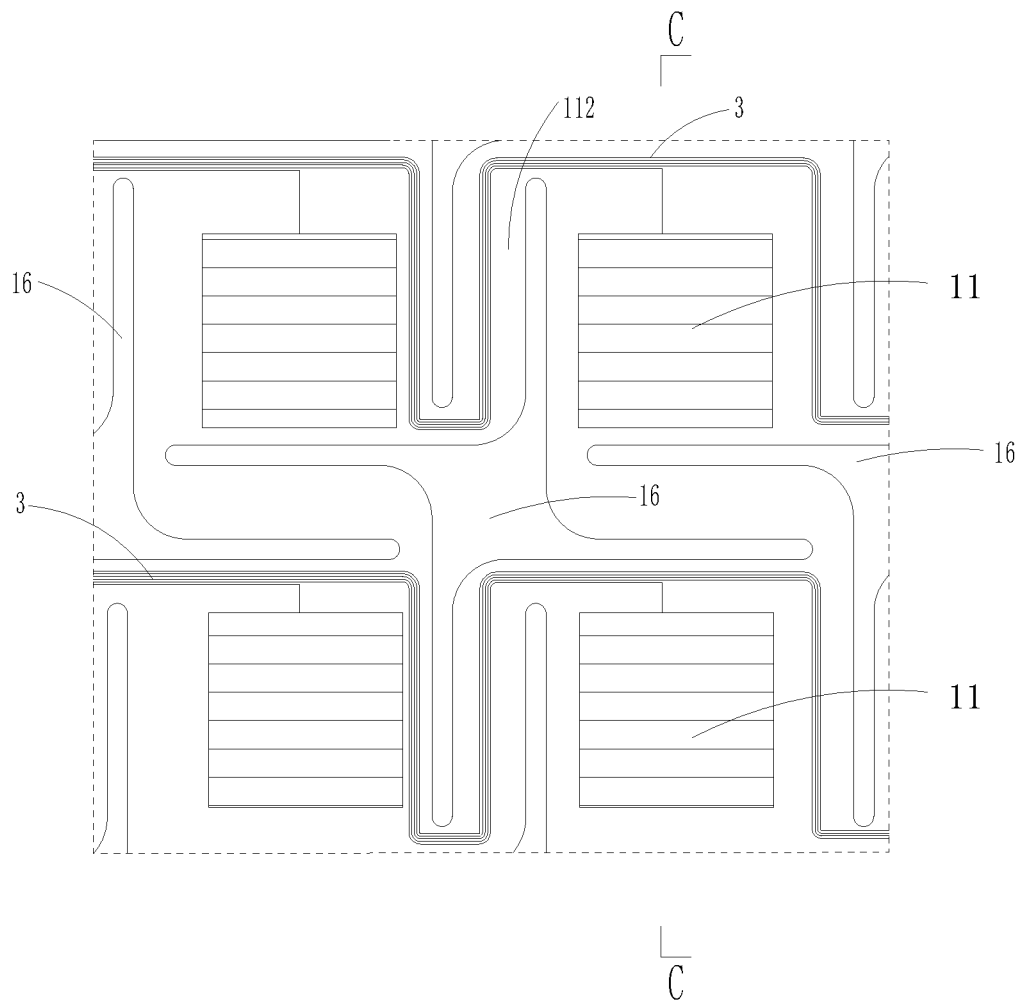
FIG. 2. is a schematic diagram of a planar structure of an enlarged light-emitting device at a position A in FIG. 1.
Figure 3:
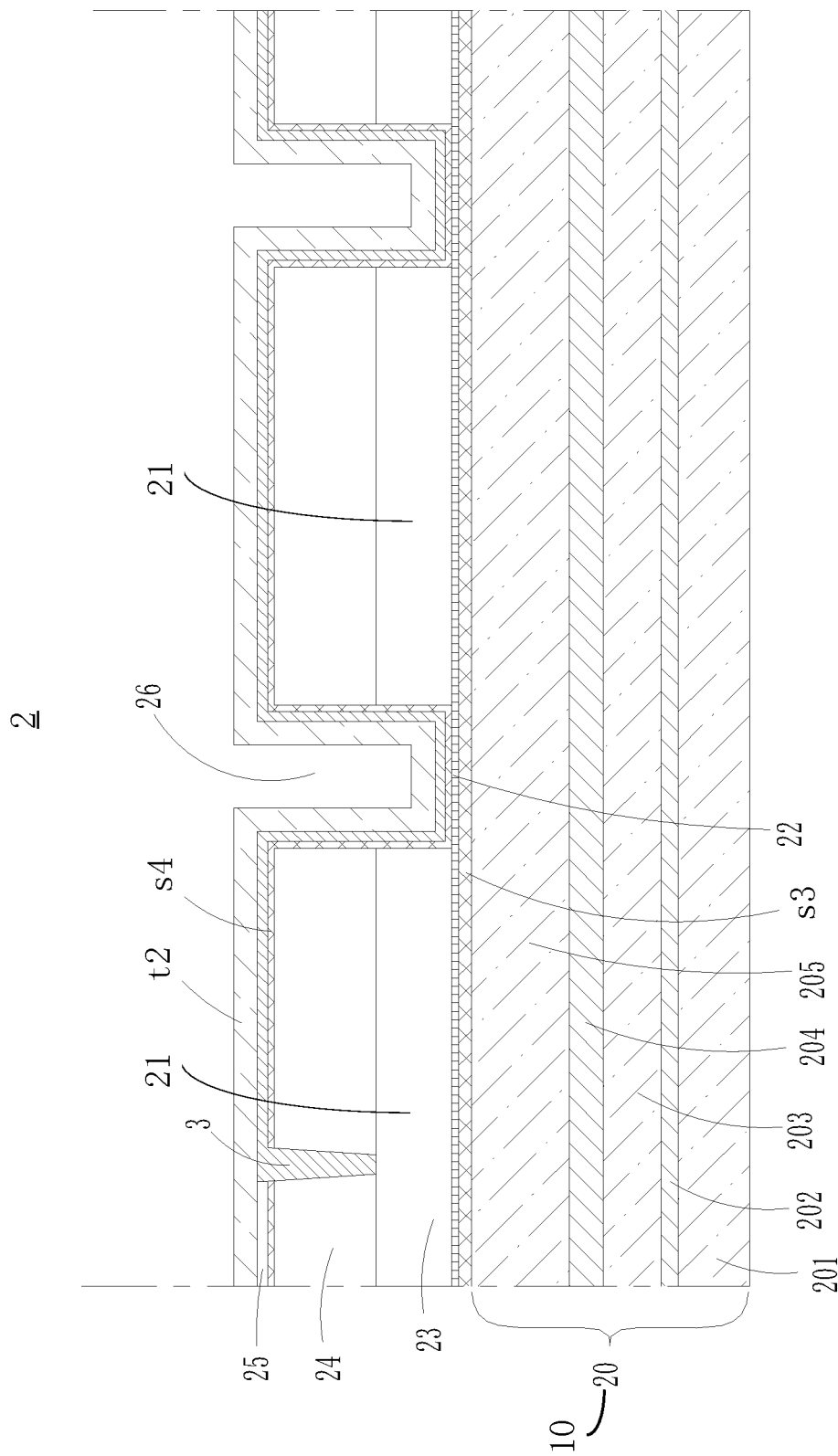
FIG. 3 is a schematic diagram of a sectional structure of the display panel shown in FIG. 1.
Figure 4:
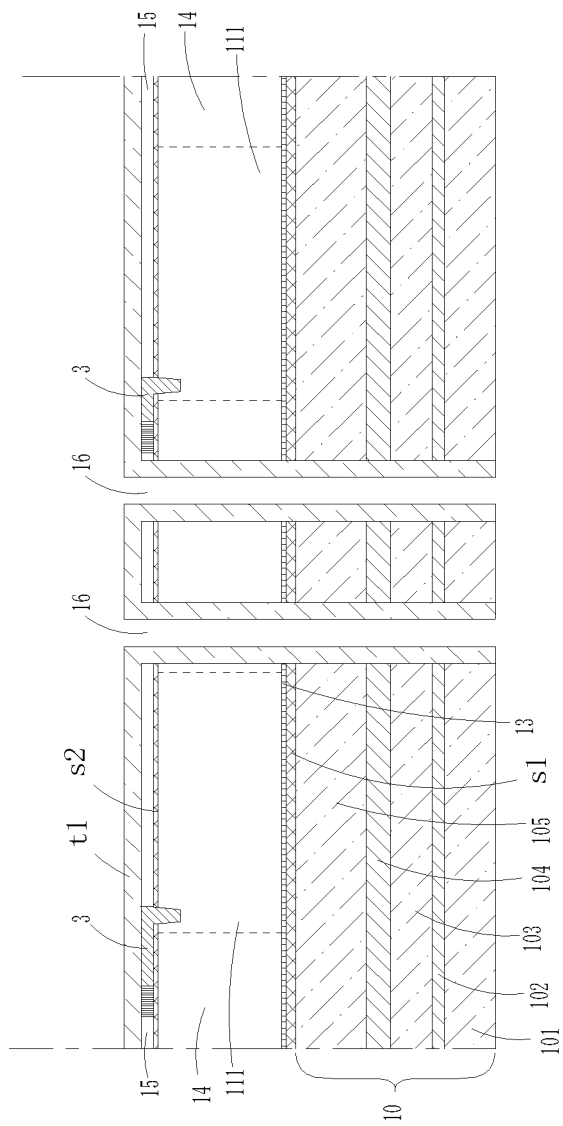
FIG. 4 is a schematic diagram of a sectional structure of the light-emitting device shown in FIG. 2.

FIG. 1 is a schematic diagram of a planar structure of a display panel according to an exemplary embodiment of the present disclosure; FIG. 2. is a schematic diagram of a planar structure of an enlarged light-emitting device at the position A in FIG. 1; FIG. 3 is a schematic diagram of a sectional structure of the display panel in FIG. 1 along a line B-B; and FIG. 4 is a schematic diagram of a sectional structure of the light-emitting device shown in FIG. 2 along a line C-C.

Referring to the figures, an embodiment of the present disclosure provides a display panel. The display panel includes a base substrate 10. The base substrate 10 includes a flexible display region 1 and a pixel circuit region 2. The base substrate 10 includes a first base disposed in the flexible display region 1 and a second base disposed in the pixel circuit region 2. The base substrate 10 shown in FIG. 4 is a part of the base substrate 10, i.e., the first base in the flexible display region. The display panel includes a plurality of display units P disposed on the base substrate 10. The display unit P includes a signal line 3, a light-emitting device 11 and a drive unit 21. The light-emitting device 11 is disposed in the flexible display region 1, and the drive unit 21 is disposed in the pixel circuit region 2. The signal line 3 is connected with the light-emitting device 11 and the drive unit 21.

In summary, in the display panel according to the embodiment of the present disclosure, the light-emitting device in the display unit is disposed in the flexible display region, the corresponding drive unit is disposed in the pixel circuit region outside the flexible display region, and the drive unit and the light-emitting device are correspondingly connected through the signal line. In this way, the drive unit can be prevented from being affected when the flexible display region deforms, and thus the drive unit is prevented from being damaged when the flexible display region deforms.

It can be known from FIG. 1 that light-emitting devices 11 arranged in n rows and m columns are provided in the flexible display region 1. Correspondingly, drive units 21 arranged in n rows and m columns are provided in the pixel circuit region 2 outside the flexible display region 1. Each light-emitting device 11 may be assigned a unique number, such as coordinate numbers in the figure: (1, 1) (the first row and the first column), . . . , and (n, m) (the nth row and $m^{th}$ column). Each drive unit 21 also has a unique number, such as the coordinate numbers in the figure: (1, 1) (the first row and the first column), . . . , and (n, m) (the nth row and $m^{th}$ column). The drive unit 21 and the light-emitting device 11 with corresponding numbers may be connected correspondingly through the signal line 3.

In this embodiment, at least the signal line 3 in the flexible display region 1 may be selected from flexible signal lines made of metal nanowires, carbon nanotubes (CNT), graphene, conductive polymers, liquid metal and the like. The metal nanowires may include copper nanowires and silver nanowires (AgNW). In a specific embodiment, by taking the silver nanowire (AgNW) as an example, a silver nanowire percolating network has extremely high transparency, and has higher transparency than indium tin oxide (ITO) at near-infrared wavelengths. In addition, a lower fusion temperature at the intersection of the silver nanowires may further reduce the resistance of the conductive network. The silver nanowire may be deposited from a solution onto the base substrate or the surfaces of some film layers on the base substrate by spraying, vacuum filtration-transfer, die-casting and the like, and the adhesiveness between the silver nanowire and the base substrate or between the silver nanowire and some film layers on the base substrate may be enhanced through polyurethane urea (PUU) to form a stretchable transparent electrode with stable performance. The junctions between the silver nanowires may also be fixed through irradiation by intense pulsed light, to further improve the stability of the electrode.

The copper nanowire not only has the conductivity comparable to that of silver, but also is cheaper. A transparent stretchable conductor based on a copper nanowire percolating network may be prepared with a plasma welding technology. The copper nanowire percolating network is irradiated by laser and junctions of the nanowires are welded under the action of heat generated at the junctions by the plasma effect. In this way, the connection strength between the nanowires is increased and the contact resistance is reduced, which greatly improves the conductivity of the percolating network. In addition, as the preparation process is conducted at a low temperature and the laser scanning speed is quick (>100 mm/s), few copper nanowires are oxidized, which is impossible to achieve with the traditional heat treatment method (integral heating). When the plasma-welded copper nanowire percolating network is attached to the base substrate or some film layers on the base substrate and various mechanical deformations such as bending, folding, and stretching are performed on the base substrate, the conductor can still maintain the good electrical stability.

The material of the signal line 3 in the pixel circuit region 2 is not limited, and may be a hard material or the above flexible and stretchable material. In addition, in order to facilitate light exit, the signal line 3 may be made of a light-transparent conductive material.

The flexible display region is a stretchable display region, as shown in FIG. 2. The flexible display region of the base substrate is provided with a plurality of grooves 16. The groove is disposed between at least two of the plurality of light-emitting devices 11. Optionally, the grooves 16 are disposed around at least one of the plurality of light-emitting devices 11. That is, the display panel in this embodiment includes a plurality of island-shaped light-emitting devices 11 spaced apart from one another, and the island-shaped light-emitting devices 11 are connected with each other through connecting bridge regions 112. The plurality of light-emitting devices 11 may be combined for image display. The connecting bridge region 112 is configured for wiring and stress transfer, and the groove 16 is configured to provide a deformation space during stretching. It should be understood that the display panel according to the embodiments of the present disclosure may include a plurality of pixel structures. Each pixel structure includes one or more light-emitting devices 11. The plurality of light-emitting devices 11 may include a group of three light-emitting devices (a red light-emitting device, a green light-emitting device, and a blue light-emitting device) emitting light of different colors or a group of four light-emitting devices (a red light-emitting device, a green light-emitting device, a blue light-emitting device, and a white light-emitting device) emitting light of different colors, and the light-emitting device may be rectangular or square. The grooves 16 around the light-emitting device 11 may be cross-shaped, H-shaped, an L-shaped, T-shaped, or the like. The width of the groove 16 may range from 10 μm to 500 μm. The connecting bridge region 112 is disposed between the light-emitting device 11 and the groove 16, or the connecting bridge region 112 is disposed between adjacent grooves 16. In addition, the connecting bridge region 112 is connected to the adjacent light-emitting device 11. That is, the connecting bridge region 112 surrounds the light-emitting device 11 and the groove 16. The connecting bridge region 112 is L-shaped, or is of a shape formed by connecting a plurality of L-shapes, such as a shape and a ⌐ shape. The width of the connecting bridge region 112 may range from 10 μm to 500 μm. The light-emitting devices 11 are all electrically connected to the pixel circuit region through the signal lines 3.

In an implementation of the present disclosure, the pixel circuit region 2 may be disposed on at least one of two opposite sides of the flexible display region 1 or the pixel circuit region 2 may surround the flexible display region 1. The base substrate may include a first base disposed in the flexible display region and a second base disposed in the pixel circuit region. The materials of the first base and the second base may include a flexible material, and the material of the first base and the material of the second base may be the same or different. In addition, the first base and the second base may be of an integrated structure.

The plan view of the display panel according to this embodiment is shown in FIG. 1. The drive units corresponding to the light-emitting devices in the flexible display region 1 are disposed in the pixel circuit region on one side, the light-emitting devices (in the embodiment of the present disclosure, the light-emitting device may include at least one OLED) for display are disposed in the flexible display region 1, and the drive units and the light-emitting devices are connected in one-to-one correspondence through bridging flexible stretchable signal lines 3. Specifically, as shown in FIG. 1, the drive unit (1,1) and the light-emitting device (1,1) are connected through a flexible signal line 3, the drive unit (2,1) and the light-emitting device (2,1) are connected through a flexible signal line 3, and so forth, and the drive unit (m, n) and the light-emitting device (m, n) are connected through a flexible signal line 3.

Figure 5:
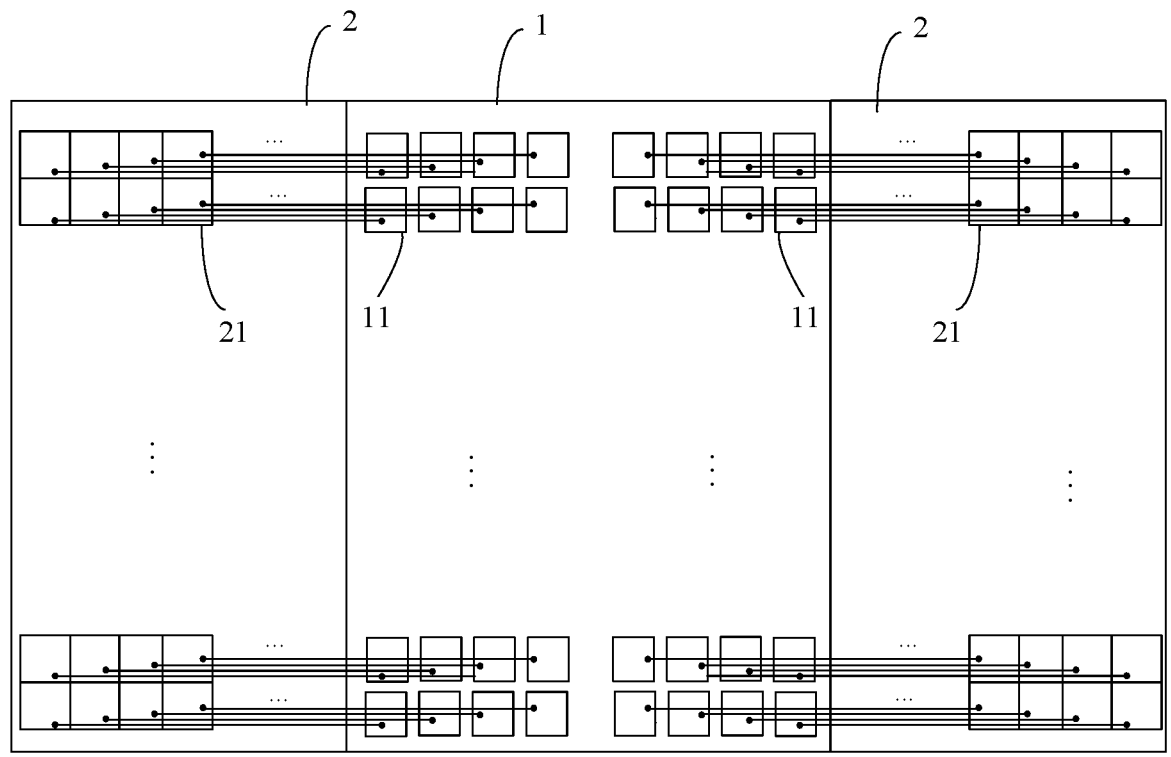
FIG. 5 is schematic diagram of a planar structure of a display panel according to another exemplary embodiment of the present disclosure.

It may be understood that the pixel circuit region 2 is not limited to being disposed on a single side of the flexible display region 1, and the pixel circuit region 2 may also be disposed on two sides of the flexible display region 1, as shown in FIG. 5.

In the embodiment in which the pixel circuit region 2 is disposed on one side of the flexible display region 1, the pixel circuit region 2 may be disposed on the side of the flexible display region 1 without tensile stress. For example, in the figures, an upper portion and a lower portion of the flexible display region 1 may be connected to a connecting component or a panel with a rigid base, such that tensile stress may be applied to the flexible display region 1 from the upper portion and the lower portion. The pixel circuit region 2 is disposed on the left side or right side of the flexible display region 1, or is disposed on both the left side and right side of the flexible display region 1. In this way, no tensile stress is generated in the pixel circuit region 2.

FIG. 4 is a schematic diagram of a sectional structure of the light-emitting device shown in FIG. 2 along a line C-C. As shown in FIG. 4, the light-emitting device includes a light-emitting layer 14 and a first electrode 13. The first electrode 13 and the light-emitting layer 14 are sequentially disposed on the base substrate 10. The signal line 3 is disposed on the base substrate 10 provided with the light-emitting devices, and the light-emitting layer 14 is connected with the signal line 3 and the first electrode 13.

Optionally, the first electrode 13 is a first electrode layer, and the light-emitting devices in the plurality of display units share the first electrode layer. The first electrode 13 may be a cathode and thus the first electrode layer is a first cathode layer.

Optionally, the display panel includes a first insulating layer s1, a second insulating layer s2, and a first encapsulating layer t1 which are disposed in the flexible display region. The first insulating layer s1 is disposed between the first electrode 13 and the base substrate 10, the second insulating layer s2 is disposed between the light-emitting layer 14 and the signal line 3, and the first encapsulating layer t1 is disposed on the side of the signal line 3 distal from the base substrate 10.

The base substrate 10 includes a first flexible base layer 101, a first barrier layer 102, a first buffer layer 103, a second barrier layer 104 and a second flexible base layer 105 which are laminated. It is to be understood that the above light-emitting layer 14 may include a hole injection layer (HIL), a hole transport layer (HTL), an emission (EML) and an electron transport layer (ETL). In this embodiment, for simplified description and for describing the arrangement of the signal line 3 and the common electrode layer, two electrode portions in the conventional "light-emitting layer" are described independently.

The first flexible base layer 101 may be made of polyimide and the thickness of the first flexible base layer 101 may range from 2 μm to 10 μm. The first barrier layer 102 and the second barrier layer 104 may be made of inorganic materials such as silicon oxide ($SiO_x$), silicon nitride ($SiN_x$), aluminum oxide ($Al_2O_3$) or silicon oxynitride ($SiO_xN_x$) and the material of the first barrier layer and the material of the second barrier layer may be the same, but different from the material of the buffer layer. The first barrier layer 102, the first buffer layer 103 and the second barrier layer 104 may be configured to improve the water and oxygen resistance of the base. The first buffer layer 103 may be made of silicon nitride ($SiN_x$) by dry etching. In this embodiment, the first buffer layer 103 may also be made of an organic material, such as polyimide, or other strippable materials, and the first buffer layer 103 is formed by coating. The second flexible base layer 105 may be made of polyimide and the thickness of the second flexible base layer ranges from 2 μm to 10 μm.

The first insulating layer s1 and the second insulating layer s2 may be made of any one or more of silicon oxide ($SiO_x$), silicon nitride ($SiN_x$) and silicon oxynitride (SiON), and may be a single layer, a multi-layer or a composite layer composed of a plurality of materials. The first insulating layer is a buffer layer and configured to improve the water and oxygen resistance of the base. The first electrode 13 may be made of one of metal materials such as magnesium (Mg), silver (Ag), aluminum (Al), copper (Cu), and lithium (Li), or an alloy of the above metals. The first electrode 13 may be a common electrode of the light-emitting devices 11 of the display units in the flexible display region 1.

The signal lines 3 of the plurality of display units may form a first wiring layer 15, and the forming process of the first wiring layer 15 may include: first forming groove-shaped patterns of the signal lines 3, and forming the signal lines 3 in the groove-shaped patterns of the signal lines 3. The signal lines 3 may be flexible signal lines made of metal nanowires, carbon nanotubes (CNT), graphene, conductive polymers, liquid metal and the like. The metal nanowires may include copper nanowires and silver nanowires (AgNW). In a specific embodiment, the silver nanowire (AgNW) is taken as an example. A silver nanowire percolating network has extremely high transparency, and has higher transparency than indium tin oxide (ITO) at near-infrared wavelengths. In addition, a lower fusion temperature at an intersection of the silver nanowires may further reduce the resistance of the conductive network. The silver nanowire may be deposited from a solution onto the first wiring layer 15 by spraying, vacuum filtration-transfer, die-casting and other means, and the adhesiveness between the silver nanowire and the first wiring layer 15 may be enhanced through polyurethane urea (PUU) to form a stretchable transparent electrode with stable performance. The junctions between the silver nanowires may also be fixed through irradiation by intense pulsed light, which further improves the stability of the electrode.

As shown in FIG. 2, the signal lines 3 of rows of light-emitting devices 11 intensively and continuously extend laterally and surround the continuous connecting bridge regions 112 and the of the island-shaped light-emitting device regions. The bent signal lines 3 may also improve the stretchable flexibility and signal lines 3 are bent to provide deformation.

In a specific embodiment of the flexible display region 1, the materials and structures of the light-emitting layer 14 and the display units therein have various solutions in the field, and are not repeated here. The material of the first encapsulating layer t1 includes polyimide, polyethylene naphthalate, polyethylene terephthalate, polyarylate, polycarbonate, polyetherimide or polyethersulfone, and the thickness of the encapsulating layer ranges from 0.5 μm to 2 μm.

In addition, persons skilled in the art can understand that the position of the first electrode 13 and the position of the first wiring layer 15 may be interchanged, and the present disclosure can still be implemented. Specifically, the signal line is disposed on the base substrate, the light-emitting device includes a light-emitting layer and a first electrode. The light-emitting layer and the first electrode are sequentially disposed on the base substrate provided with the signal line, and the light-emitting layer is connected with the signal line and the first electrode. Optionally, the display panel includes a first insulating layer, a second insulating layer and a first encapsulating layer which are disposed in the flexible display region. The first insulating layer is disposed between the signal line and the light-emitting layer, the second insulating layer is disposed between the light-emitting layer and the first electrode, and the first encapsulating layer is disposed on the side of the first electrode distal from the base substrate. In addition, compared with the previous implementation, since the signal line is formed first and then the light-emitting layer and other structures are formed and there may be no other line structures under the signal line, no first insulating layer may be disposed between the signal line and the base substrate.

It may be understood that in the preparation of structures in the flexible display region 1 according to the above embodiment, the patterned base substrate 10 may be formed on a rigid substrate (such as a glass substrate) first, and then the first insulating layer s1, the first cathode layer including the first electrodes 13, the light-emitting layer 14, the first wiring layer 15, the second insulating layer s2 and the first encapsulating layer t1 are formed sequentially. The first cathode layer may be a common electrode of the various light-emitting devices 11, and each light-emitting device 11 is connected to the corresponding drive unit 21 in the pixel circuit region 2 through one dedicated signal line 3.

FIG. 3 is a schematic diagram of a sectional structure of the display panel in FIG. 1 along a line B-B. As shown in FIG. 3, the pixel circuit region 2 in this embodiment may include a signal line layer 25 from the view of a section, a drive circuit layer 23 and a flexible layer 24 which are sequentially disposed in the pixel circuit region 2. The drive circuit layer 23 includes a plurality of drive circuits 21, and the signal line layer 25 includes a plurality of signal lines 3 and the signal line layer 25 is disposed on the side of the flexible layer 24 distal from the base substrate 10. The display panel further includes a third insulating layer s3, a fourth insulating layer s4 and a second encapsulating layer t2 which are disposed in the pixel circuit region 2. The third insulating layer s3 is disposed between the base substrate 10 and the drive circuit layer 23, the fourth insulating layer s4 is disposed between the flexible layer 24 and the signal line layer 25, and the second encapsulating layer t2 is disposed on the side of the signal line layer 25 distal from the base substrate 10. In addition, the display panel may further include a second cathode layer 22 disposed between the third insulating layer s3 and the drive circuit layer 23. The second cathode layer 22 may be a common electrode of the various drive units 21 in the pixel circuit region 2.

The portion, in the pixel circuit region 2, of the base substrate 10 may be the second base 20. The second base 20 includes a third flexible base layer 201, a third barrier layer 202, a second buffer layer 203, a fourth barrier layer 204 and a fourth flexible base layer 205 which are laminated.

The third flexible base layer 201 may be made of polyimide and the thickness of the third flexible base layer 201 ranges from 2 μm to 10 μm. The third barrier layer 202 and the fourth barrier layer 204 may be made of inorganic materials such as silicon oxide ($SiO_x$), silicon nitride ($SiN_x$), aluminum oxide ($Al_2O_3$) or silicon oxynitride ($SiO_xN_x$), the material of the third barrier layer 202 and the material of the fourth barrier layer 204 may be the same, but different from the material of the second buffer layer 203. The third barrier layer 202, the second buffer layer 203 and the fourth barrier layer 204 may be configured to improve the water and oxygen resistance of the base. The second buffer layer 203 may be made of silicon nitride ($SiN_x$) by dry etching. In this embodiment, the second buffer layer 203 may also be made of an organic material, such as polyimide, or other strippable materials, by coating. The fourth flexible base layer 205 may be made of polyimide and the thickness of the fourth flexible base layer 205 ranges from 2 μm to 10 μm.

Each of the third insulating layer s3 and the fourth insulating layer s4 may be made of any one or more of silicon oxide ($SiO_x$), silicon nitride ($SiN_x$) and silicon oxynitride (SiON), and may be a single layer, a multi-layer or a composite layer. The third insulating layer is a buffer layer and configured to improve the water and oxygen resistance of the base. The second cathode layer 22 may be made of one of metal materials such as magnesium (Mg), silver (Ag), aluminum (Al), copper (Cu), and lithium (Li), or an alloy of the above metal. The second cathode layer 22 may be a common electrode of the various drive units 21 in the pixel circuit region 2.

The material of the second encapsulating layer t2 includes polyimide, polyethylene naphthalate, polyethylene terephthalate, polyarylate, polycarbonate, polyetherimide or polyethersulfone and the thickness of the second encapsulating layer t2 ranges from 0.5 µm to 2 µm.

It is to be understood that in the preparation of structures in the pixel circuit region 2 according to the above embodiment, the second base 20 may be formed on a rigid substrate (such as a glass substrate) first, and then the third insulating layer s3, the second cathode layer 22, the drive circuit layer 23, the flexible layer 24, the fourth insulating layer s4, the signal line layer 25, and the second encapsulating layer t2 are sequentially formed. The second cathode layer 22 may be a common electrode of the various drive units 21 in the pixel circuit region 2, and each drive unit 21 is connected with the corresponding light-emitting device 11 in the flexible display region 1 through one dedicated signal line 3.

The drive circuit layer 23 includes a plurality of drive units composed of thin film transistors (TFTs). The drive unit may also be referred to as a pixel drive circuit.

The flexible layer 24 may be made of any one or more of elastic resin materials such as phenol-based resin, polypropylene-based resin, polyimide-based resin, and propylene-based resin, and may be a single layer, a multi-layer or a composite layer. The flexible layer 24 is configured to provide a deformation buffer for the signal line 3.

In addition, the base substrate includes a plurality of slots 26 disposed in the pixel circuit region 2. The slot 26 extends along the thickness direction of the base substrate, and is disposed between at least two drive units 21 to space the drive units 21 in the drive circuit layer 23. In this way, the signal line 3 is bent in a U-shaped fashion in the thickness direction of the base substrate, such that a deformation space is provided for the stretching deformation of the signal line 3 in the pixel circuit region 2.

In addition, persons skilled in the art can understand that the position of the second cathode layer 22 and the position of the signal line layer 25 may be interchanged, and the present disclosure can still be implemented. Specifically, the display panel includes a drive circuit layer and a flexible layer which are sequentially disposed in the pixel circuit region. The signal line layer is disposed between the drive circuit layer and the base substrate, the drive circuit layer includes a plurality of drive units, and the signal line layer includes a plurality of signal line. In an implementation, the display panel may include a second base disposed in the pixel circuit region, and a signal line layer, a third insulating layer, a drive circuit layer, a flexible layer, a second cathode layer and a second encapsulating layer which are sequentially formed on the second base. The second base may be made of a stretchable material, and the second wiring layer 25 includes a plurality of signal lines. Compared with the previous implementation, since the signal lines are formed on the second base which is insulative, no insulating layer may be disposed between the signal line layer and the second base. Certainly, an insulating layer may also be disposed between the signal line layer and the second base, which is s not limited in the embodiments of the present disclosure.

In summary, in the display panel according to the embodiment of the present disclosure, the light-emitting devices in the display units are disposed in the flexible display region, the corresponding drive units are disposed in the pixel circuit region outside the flexible display region, and the drive unit and the light-emitting device are correspondingly connected through the signal line. Thus, the drive units may be prevented from being affected when the flexible display region deforms, thereby preventing the drive units from being damaged when the flexible display region deforms.

Figure 6:
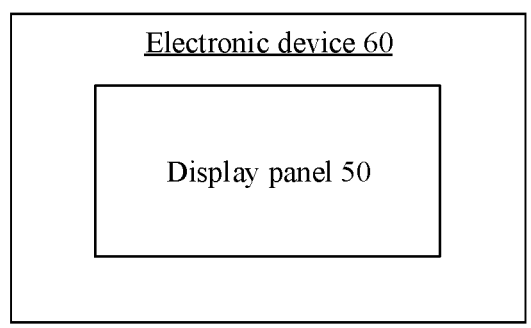
FIG. 6 is a block diagram of an electronic device according to an embodiment of the present disclosure.

Referring to FIG. 6, which is a block diagram of an electronic device according to an embodiment of the present disclosure, the electronic device 60 includes a display panel 50. The display panel 50 may be any of the display panels provided above.

The electronic device may be incorporated into various wearable objects. For example, the electronic device may be incorporated onto clothes, pants, hats, flags, or various straps (such as belts, headbands and wristbands).

According to an aspect of the present disclosure, a display panel is provided. The display panel includes a stretchable display region, a pixel circuit region, and a plurality of signal lines. The stretchable display region includes a plurality of pixel units, and the pixel circuit region includes a plurality of drive units. The plurality of drive units and the plurality of the pixel units are connected in a one-to-one correspondence by the plurality of the signal lines.

In an implementation of the present disclosure, the stretchable display region includes a first base, and a first insulating layer, a first cathode layer, a light-emitting layer, a second insulating layer, a first wiring layer and a first encapsulating layer which are sequentially formed on the first base. The first base is made of a stretchable material and the first wiring layer includes a plurality of signal lines.

In an implementation of the present disclosure, the stretchable display region includes a first base, and a first wiring layer, a first insulating layer, a light-emitting layer, a first cathode layer, and a first encapsulating layer which are sequentially formed on the first base. The first base is made of a stretchable material and the first wiring layer includes a plurality of signal lines.

In an implementation of the present disclosure, the pixel unit includes a plurality of island-shaped display units spaced apart from one another, a plurality of hollowed-out portions surround each of the display units, and the display units are electrically connected through the signal lines.

In an implementation of the present disclosure, each of the hollowed-out portions runs through or partially runs through the first base.

In an implementation of the present disclosure, the first cathode layer is a common electrode of the various display units, and each of the display units is connected to the corresponding drive unit in the pixel circuit region through at least one signal line.

In an implementation of the present disclosure, the pixel circuit region includes a second base, and a third insulating layer, a second cathode layer, a drive circuit layer, a flexible stretching layer, a fourth insulating layer, a second wiring layer and a second encapsulating layer, which are sequentially formed on the second base. The second base is made of a stretchable material and the second wiring layer includes a plurality of signal lines.

In an implementation of the present disclosure, the pixel circuit region includes a second base, and a second wiring layer, a third insulating layer, a drive circuit layer, a flexible stretching layer, a second cathode layer and a second encapsulating layer which are sequentially formed on the second base. The second base is made of a stretchable material, and the second wiring layer includes a plurality of signal lines.

In an implementation of the present disclosure, the pixel circuit region further includes a plurality of slots. The slots extend in a direction perpendicular to the signal lines, to space the drive units in the drive circuit layer.

In an implementation of the present disclosure, the pixel circuit region is disposed on one side of the stretchable display region, or two opposite sides of the stretchable display region.

In an implementation of the present disclosure, the signal line is made of a light-transparent conductive material.

In an implementation of the present disclosure, the signal line is made of a metal nanowire, a carbon nanotube, graphene, a conductive polymer or liquid metal.

In an implementation of the present disclosure, the stretchable display region and the pixel circuit region share the base, the wiring layer of the signal lines and/or the encapsulating layer.

According to another aspect of the present disclosure, an electronic device is provided. The electronic device includes the display panel as described above.

It can be known from the above technical solutions that the display panel and the electronic device according to the present disclosure have the following advantages and positive effects.

The display panel includes the stretchable display region, the pixel circuit region and the plurality of signal lines. The stretchable display region includes the plurality of pixel units, the pixel circuit region includes the plurality of drive units, and the plurality of drive units and the plurality of pixel units are connected in a one-to-one correspondence by the plurality of signal lines, such that the drive circuits of the various pixels of the AMOLED in the stretching region are disposed in the pixel circuit region outside the stretching region, and are connected to the pixel display region through signal lines. In this way, the thin film transistor drive circuits is disposed in the non-stretching region and thus does not bear the stress caused by stretching, which can avoid the drive circuits from being damaged.

It should be noted that in this disclosure, the relational terms such as "first" and "second" are merely used to distinguish one entity or operation from another entity or operation, and do not necessarily require or imply that these entities or operations have any such actual relationship or order. Furthermore, the terms "including" "comprising" or any other variants are intended to cover the nonexclusive inclusion, such that the process, method, object or device including a series of elements not only includes those elements, but also includes other elements which are not explicitly listed, or also includes the inherent elements of such process, method, object or device. Without more limitations, the element defined by the phrase "including a . . . " does not exclude the existence of other same elements in the process, method, object, or device that including such element.

The above descriptions are merely specific embodiments of the present disclosure, and are provided so that persons skilled in the art may understand or implement the present disclosure. Various modifications to these embodiments will be obvious to persons skilled in the art, and the general principles defined herein may be implemented in other embodiments without departing from the spirit or scope of the present disclosure. Thus, the present disclosure is not limited to the embodiments shown herein, but should conform to the widest scope consistent with the principles and novel features of the present disclosure.

What is claimed is:

1. A display panel, comprising:
a base substrate comprising a flexible display region and a pixel circuit region side by side, the flexible display region being a stretchable display region, and the pixel circuit region being disposed on a side of the flexible display region without tensile stress; and
a plurality of display units disposed on the base substrate, wherein each of the display units comprises a signal line, a light-emitting device and a drive unit, wherein a plurality of the light-emitting devices are disposed in the flexible display region, a plurality of the drive units are disposed in the pixel circuit region, and the signal line is connected with the light-emitting device and the drive unit.

2. The display panel according to claim 1, wherein the light-emitting device comprises a light-emitting layer and a first electrode, wherein the first electrode and the light-emitting layer are sequentially disposed on the base substrate, the signal line is disposed on the base substrate provided with the light-emitting device, and the light-emitting layer is connected with the signal line and the first electrode.

3. The display panel according to claim 1, wherein the signal line is disposed on the base substrate, and the light-emitting device comprises a light-emitting layer and a first electrode, wherein the light-emitting layer and the first electrode are sequentially disposed on the base substrate provided with the signal line, and the light-emitting layer is connected with the signal line and the first electrode.

4. The display panel according to claim 2, wherein the first electrode is a first electrode layer, and the light-emitting devices in the plurality of display units share the first electrode layer.

5. The display panel according to claim 1, wherein the flexible display region is a stretchable display region and is provided with a plurality of grooves, wherein the groove is disposed between the light-emitting devices in at least two of the plurality of display units.

6. The display panel according to claim 5, wherein the grooves are disposed around the light-emitting device in at least one of the plurality of display units.

7. The display panel according to claim 5, wherein the plurality of grooves comprise at least one type of sunken grooves and through grooves.

8. The display panel according to claim 2, comprising a first insulating layer, a second insulating layer and a first encapsulating layer which are disposed in the flexible display region, wherein the first insulating layer is disposed between the first electrode and the base substrate, the second insulating layer is disposed between the light-emitting layer and the signal line, and the first encapsulating layer is disposed on a side of the signal line distal from the base substrate.

9. The display panel according to claim 3, comprising a first insulating layer, a second insulating layer and a first encapsulating layer which are disposed in the flexible display region, wherein the first insulating layer is disposed between the signal line and the light-emitting layer, the second insulating layer is disposed between the light-emitting layer and the first electrode, and the first encapsulating layer is disposed on a side of the first electrode distal from the base substrate.

10. The display panel according to claim 2, comprising a signal line layer, and a drive circuit layer and a flexible layer which are sequentially disposed in the pixel circuit region, wherein the drive circuit layer comprises a plurality of drive units, and the signal line layer comprises a plurality of signal lines and the signal line layer is disposed on a side of the flexible layer distal from the base substrate.

11. The display panel according to claim 10, further comprising a third insulating layer, a fourth insulating layer and a second encapsulating layer which are disposed in the pixel circuit region, wherein the third insulating layer is disposed between the base substrate and the drive circuit layer, the fourth insulating layer is disposed between the flexible layer and the signal line layer, and the second encapsulating layer is disposed on a side of the signal line layer distal from the base substrate.

12. The display panel according to claim 1, comprising a signal line layer, and a drive circuit layer and a flexible layer which are sequentially disposed in the pixel circuit region, wherein the signal line layer is disposed between the drive circuit layer and the base substrate, the drive circuit layer comprises a plurality of drive units, and the signal line layer comprises a plurality of signal lines.

13. The display panel according to claim 1, wherein the base substrate comprises a plurality of slots in the pixel circuit region, wherein the slot is disposed between at least two of the drive units.

14. The display panel according to claim 2, wherein the signal line is made of a light-transparent conductive material.

15. The display panel according to claim 13, wherein a material of the signal line comprises one of a metal nanowire, a carbon nanotube, graphene, a conductive polymer and liquid metal.

16. The display panel according to claim 1, wherein the pixel circuit region is disposed on at least one of two opposite sides of the flexible display region.

17. The display panel according to claim 1, wherein the base substrate comprises a first base disposed in the flexible display region and a second base disposed in the pixel circuit region, wherein a material of the first base and a material of the second base comprise a flexible material.

18. The display panel according to claim 17, wherein the first base and the second base are of an integrated structure.

19. The display panel according to claim 1, wherein the signal line is disposed on the base substrate; and the light-emitting device comprises a light-emitting layer and a first electrode, wherein the first electrode and the light-emitting layer are sequentially disposed on the base substrate provided with the signal line, the light-emitting layer is connected with the signal line and the first electrode, the first electrode is a first electrode layer, and the light-emitting devices in the plurality of display units share the first electrode layer;
the flexible display region is provided with a plurality of grooves, wherein the groove is disposed between the light-emitting devices in at least two of the plurality of display units;
the grooves are disposed around the light-emitting device in at least one of the plurality of display units;
the display panel comprises a first insulating layer, a second insulating layer and a first encapsulating layer which are disposed in the flexible display region, wherein the first insulating layer is disposed between the first electrode and the base substrate, the second insulating layer is disposed between the light-emitting layer and the signal line, and the first encapsulating layer is disposed on a side of the signal line distal from the base substrate;
the display panel comprises a signal line layer, and a drive circuit layer and a flexible layer which are sequentially disposed in the pixel circuit region, wherein the drive circuit layer comprises a plurality of drive units, and the signal line layer comprises a plurality of signal lines and the signal line layer is disposed on a side of the flexible layer distal from the base substrate;
the display panel further comprises a third insulating layer, a fourth insulating layer and a second encapsulating layer which are disposed in the pixel circuit region, wherein the third insulating layer is disposed between the base substrate and the drive circuit layer, the fourth insulating layer is disposed between the flexible layer and the signal line layer, and the second encapsulating layer is disposed on a side of the signal line layer distal from the base substrate; and
the first encapsulating layer and the second encapsulating layer are of an integrated structure.

20. An electronic device, comprising a display panel, wherein the display panel comprises:
a base substrate, comprising a flexible display region and a pixel circuit region side by side, the flexible display region being a stretchable display region, and the pixel circuit region being disposed on a side of the flexible display region without tensile stress; and
a plurality of display units disposed on the base substrate, wherein each of the display units comprises a signal line, a light-emitting device and a drive unit, wherein a plurality of the light-emitting devices are disposed in the flexible display region, a plurality of the drive units are disposed in the pixel circuit region, and the signal line is connected with the light-emitting device and the drive unit.

* * * * *